(12) United States Patent
Peeters et al.

(10) Patent No.: US 9,304,401 B2
(45) Date of Patent: Apr. 5, 2016

(54) MEASUREMENT OF THE POSITION OF A RADIATION BEAM SPOT IN LITHOGRAPHY

(75) Inventors: Felix Godfried Peter Peeters, Heide (NL); Jozef Petrus Henricus Benschop, Veldhoven (NL); Michael Jozef Mathijs Renkens, Sittard (NL); Gregor Edward Van Baars, Eindhoven (NL); Jeroen Dekkers, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 316 days.

(21) Appl. No.: 14/001,478

(22) PCT Filed: Feb. 22, 2012

(86) PCT No.: PCT/EP2012/052984
§ 371 (c)(1),
(2), (4) Date: Aug. 23, 2013

(87) PCT Pub. No.: WO2012/130532
PCT Pub. Date: Oct. 4, 2012

(65) Prior Publication Data
US 2013/0335721 A1    Dec. 19, 2013

Related U.S. Application Data

(60) Provisional application No. 61/525,517, filed on Aug. 19, 2011, provisional application No. 61/468,852, filed on Mar. 29, 2011.

(51) Int. Cl.
*G03B 27/32* (2006.01)
*G03B 27/54* (2006.01)
(Continued)

(52) U.S. Cl.
CPC ............ *G03F 7/70133* (2013.01); *G03F 7/704* (2013.01); *G03F 7/708* (2013.01);
(Continued)

(58) Field of Classification Search
CPC ............ G03F 7/70133; G03F 7/70275; G03F 7/70366; G03F 7/70375; G03F 7/70391; G03F 7/704; G03F 7/70516; G03F 7/7055; G03F 7/708; G03F 7/7085; G03F 9/7007; G03F 9/7019; G03F 9/7073; G03F 9/7088
USPC .................................. 355/67, 68, 71, 72, 77
See application file for complete search history.

(56) References Cited

U.S. PATENT DOCUMENTS

| 4,090,206 A | 5/1978 | Pfeifer |
| 4,447,126 A | 5/1984 | Heidrich |

(Continued)

FOREIGN PATENT DOCUMENTS

| DE | 4315580 | 11/1994 |
| DE | 4315581 | 11/1994 |

(Continued)

OTHER PUBLICATIONS

Singapore Written Opinion mailed Jun. 17, 2015 in corresponding Singapore Patent Application No. 2013065149.

(Continued)

*Primary Examiner* — Colin Kreutzer
(74) *Attorney, Agent, or Firm* — Pillsbury Winthrop Shaw Pittman LLP

(57) ABSTRACT

A radiation spot measurement system for a lithographic apparatus, the system having a target onto which a radiation system of the lithographic apparatus may project spots of radiation for a measurement process, the target having a measurement target. The system further includes a radiation detector to detect radiation from one of the spots, and a controller to receive information from the radiation detector and to determine the position of the spot of radiation relative to an intended position of the spot of radiation.

20 Claims, 7 Drawing Sheets

(51) Int. Cl.
  *G03B 27/58* (2006.01)
  *G03B 27/72* (2006.01)
  *G03B 27/74* (2006.01)
  *G03F 7/20* (2006.01)
  *G03F 9/00* (2006.01)

(52) U.S. Cl.
  CPC ......... *G03F 7/7085* (2013.01); *G03F 7/70375* (2013.01); *G03F 7/70391* (2013.01); *G03F 7/70516* (2013.01); *G03F 9/7019* (2013.01); *G03F 7/70275* (2013.01)

(56) References Cited

U.S. PATENT DOCUMENTS

| | | | |
|---|---|---|---|
| 4,520,472 A | 5/1985 | Reno | |
| 4,525,729 A | 6/1985 | Agulnek | |
| 4,640,573 A | 2/1987 | Kataoka | |
| 4,780,730 A | 10/1988 | Dodge | |
| 4,796,038 A | 1/1989 | Allen | |
| 4,844,568 A | 7/1989 | Suzuki | |
| 4,864,216 A | 9/1989 | Kalata | |
| 4,952,949 A | 8/1990 | Uebbing | |
| 5,051,762 A | 9/1991 | Lea | |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,457,488 A | 10/1995 | Nakamura | |
| 5,481,392 A | 1/1996 | Damer | |
| 5,523,193 A | 6/1996 | Nelson | |
| 5,568,320 A | 10/1996 | Rees | |
| 5,589,973 A | 12/1996 | King | |
| 5,610,754 A | 3/1997 | Gheen | |
| 5,668,587 A | 9/1997 | Hammond | |
| 5,705,788 A | 1/1998 | Beyer | |
| 5,838,024 A | 11/1998 | Masuda | |
| 5,840,451 A | 11/1998 | Moore | |
| 6,037,965 A | 3/2000 | Gross | |
| 6,133,986 A | 10/2000 | Johnson | |
| 6,204,875 B1 | 3/2001 | De Loor | |
| 6,268,613 B1 | 7/2001 | Cantu | |
| 6,310,710 B1 | 10/2001 | Shahar | |
| 6,313,862 B1 | 11/2001 | Berner | |
| 6,466,352 B1 | 10/2002 | Shahar | |
| 6,531,681 B1 | 3/2003 | Markle | |
| 6,559,438 B1 | 5/2003 | Drobot | |
| 6,683,727 B1 | 1/2004 | Goring | |
| 6,765,647 B1 | 7/2004 | Nishi | |
| 6,795,169 B2 | 9/2004 | Tanaka | |
| 6,967,711 B2 | 11/2005 | Gui | |
| 7,116,402 B2 | 10/2006 | Gui | |
| 7,183,566 B2 | 2/2007 | Baselmans et al. | |
| 7,307,694 B2 | 12/2007 | Venema | |
| 7,388,663 B2 | 6/2008 | Gui | |
| 7,459,247 B2 | 12/2008 | Bijnen et al. | |
| 7,969,636 B2 | 6/2011 | Naito | |
| 2002/0115021 A1 | 8/2002 | Piao | |
| 2002/0126479 A1 | 9/2002 | Zhai | |
| 2002/0171047 A1 | 11/2002 | Chan | |
| 2003/0043582 A1 | 3/2003 | Chan | |
| 2003/0091277 A1 | 5/2003 | Mei | |
| 2004/0025180 A1 | 2/2004 | Begeja et al. | |
| 2004/0124372 A1 | 7/2004 | Gil | |
| 2004/0135159 A1 | 7/2004 | Siegel | |
| 2004/0252180 A1* | 12/2004 | Takada | 347/239 |
| 2004/0257629 A1 | 12/2004 | Noehte | |
| 2005/0167508 A1 | 8/2005 | Syms | |
| 2005/0271421 A1 | 12/2005 | Uemura et al. | |
| 2006/0001855 A1 | 1/2006 | Lof | |
| 2006/0103719 A1 | 5/2006 | Katzir | |
| 2006/0108508 A1 | 5/2006 | Khalid | |
| 2006/0132745 A1 | 6/2006 | Ikedo | |
| 2006/0141373 A1 | 6/2006 | Bijnen et al. | |
| 2007/0002301 A1* | 1/2007 | Venema | 355/69 |
| 2007/0034890 A1 | 2/2007 | Daschner | |
| 2007/0182808 A1 | 8/2007 | Stiblert | |
| 2007/0296936 A1 | 12/2007 | Kato | |
| 2008/0042969 A1 | 2/2008 | Baker | |
| 2008/0047445 A1 | 2/2008 | Berner | |
| 2008/0137051 A1 | 6/2008 | Maly | |
| 2008/0160211 A1 | 7/2008 | Siegel | |
| 2008/0210888 A1 | 9/2008 | Inoue | |
| 2008/0237490 A1 | 10/2008 | Lee et al. | |
| 2009/0268179 A1 | 10/2009 | Park et al. | |
| 2009/0296063 A1 | 12/2009 | Opower | |
| 2010/0142757 A1 | 6/2010 | Sandstrom | |
| 2010/0265557 A1 | 10/2010 | Sallander | |
| 2011/0012010 A1* | 1/2011 | Major | 250/201.1 |
| 2011/0051211 A1 | 3/2011 | Walther | |
| 2011/0188016 A1 | 8/2011 | De Jager | |

FOREIGN PATENT DOCUMENTS

| | | |
|---|---|---|
| DE | 19813127 | 10/1998 |
| EP | 1 835 347 | 9/2007 |
| EP | 1 843 204 | 10/2007 |
| JP | 57-152273 | 9/1982 |
| JP | 06-275936 | 9/1994 |
| JP | 2003-220484 | 8/2003 |
| JP | 2004-356632 | 12/2004 |
| JP | 2006-201586 | 8/2006 |
| JP | 2006-308994 | 11/2006 |
| JP | 2007-13157 | 1/2007 |
| JP | 2010-268005 | 11/2010 |
| WO | 97/34171 | 9/1997 |
| WO | 98/33096 | 7/1998 |
| WO | 98/38597 | 9/1998 |
| WO | 2004/019079 | 3/2004 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |

OTHER PUBLICATIONS

LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.
JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.
International Search Report mailed May 16, 2012 in corresponding International Patent Application No. PCT/EP2012/052984.
International Preliminary Report on Patentability and Written Opinion mailed Oct. 10, 2013 in corresponding International Patent Application No. PCT/EP2012/052984.
Taiwan Office Action dated Jan. 23, 2015 in corresponding Taiwan Patent Application No. 101108360.
Japanese Office Action mailed Sep. 16, 2014 in corresponding Japanese Patent Application No. 2014-501497.

* cited by examiner

MEASUREMENT OF THE POSITION OF A RADIATION BEAM SPOT IN LITHOGRAPHY

CROSS-REFERENCE TO RELATED APPLICATIONS

This application is the U.S. national phase entry of PCT Patent Application No. PCT/EP2012/052984, filed on Feb. 22, 2012, which claims the benefit of priority of U.S. provisional application No. 61/525,517, which was filed on Aug. 19, 2011 and claims the benefit of U.S. provisional application No. 61/468,852, which was filed on Mar. 29, 2011 and which is incorporated herein in its entirety by reference.

FIELD

The present invention relates to a lithographic apparatus, a method for measuring radiation beam spot position, a method for manufacturing a device, and a radiation detector system for a lithographic apparatus.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device. This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micromirror arrays, liquid crystal display (LCD) arrays, grating light valve arrays, arrays of self-emissive contrast devices and the like.

SUMMARY

A maskless lithographic apparatus may be provided with, for example, an optical column to create a pattern on a target portion of a substrate. The optical column may be provided with: a self emissive contrast device configured to emit a beam and a projection system configured to project at least a portion of the beam onto the target portion. The apparatus may be provided with an actuator to move the optical column or a part thereof with respect to the substrate. Thereby, the beam may be moved with respect to the substrate and optionally the substrate is moved with respect to the beam. By switching "on" or "off" the self-emissive contrast device during the movement, a pattern on the substrate may be created.

In a lithographic apparatus as above, the apparatus may include a programmable patterning device, such as the self-emissive contrast device, providing a plurality of radiation beams and a projection system that may project the plurality of radiation beams onto a substrate to form respective spots of radiation. In a lithographic process using such an apparatus, it is desired to help ensure that the image projected onto the substrate is accurately formed.

In the case of a lithographic process in which the image is formed by projecting multiple spots of radiation onto the substrate at different locations, while switching "on" or "off" a self-emissive contrast device, for example, the accuracy in formation of an image may be affected by the accuracy of pointing of the beams of radiation on the substrate. The accuracy of pointing of the beams of radiation on the substrate may affect the location at which each of the spots of radiation corresponding to the beams of radiation is projected. Accordingly, an error in the angle of pointing of one or more of the beams of radiation may result in distortion of the image formed on the substrate.

It is therefore desirable, for example, to provide a system that may reduce the effect of an error of the angle of pointing of a radiation beam.

According to an embodiment of the invention, there is provided a lithographic apparatus, comprising:

a programmable patterning device, configured to provide a plurality of radiation beams;

a projection system, configured to project the plurality of radiation beams onto a substrate to form respective spots of radiation; and a radiation spot measurement system, comprising:

a target, onto which the spots of radiation may be projected for a spot measurement process, the target comprising a measurement target;

a radiation detector, configured to detect radiation from one of the spots of radiation that has been projected onto the measurement target; and a controller, configured to receive information from the radiation detector and, based on the information, to determine at least the position of the spot of radiation relative to an intended position of the spot of radiation on the target in a plane substantially parallel to an upper surface of the target.

According to an embodiment of the invention, there is provided a method for measuring radiation beam spot position in a lithographic apparatus that comprises that comprises a programmable patterning device to provide a plurality of radiation beams and a projection system to project the plurality of radiation beams onto a substrate to form respective spots of radiation, the method comprising:

projecting the spots of radiation onto a target comprising a measurement target;

using a radiation detector to detect radiation from one of the spots of radiation that has been projected onto the measurement target; and determining at least the position of the spot of radiation relative to an intended position of the spot of radiation in a plane substantially parallel to an upper surface of the target based on information from the radiation detector.

According to an embodiment of the invention, there is provided a device manufacturing method, comprising:

using a method described herein to measure the radiation beam spot position of at least one of the plurality of radiation beams in the lithographic apparatus relative to a corresponding intended position; and using the determined spot position to control a parameter of the lithographic apparatus while projecting the plurality of beams of radiation onto a substrate.

According to an embodiment of the invention, there is provided a radiation detector system for a lithographic apparatus, comprising:

a radiation detector configured to detect radiation;

a substrate table configured to support a substrate, wherein the radiation detector is in or on the substrate table;

a radiation detector alignment marker spatially fixed in relation to the substrate table or in relation to the radiation detector;

a radiation detector alignment marker inspection system configured to inspect the radiation detector alignment marker and determine the position of the radiation detector relative to the substrate table or an object fixed to the substrate table based on the inspection of the radiation detector alignment marker; and an actuator system configured to control the position of the radiation detector relative to the substrate table or the object fixed to the substrate table, such that the radiation detector can detect radiation at different positions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
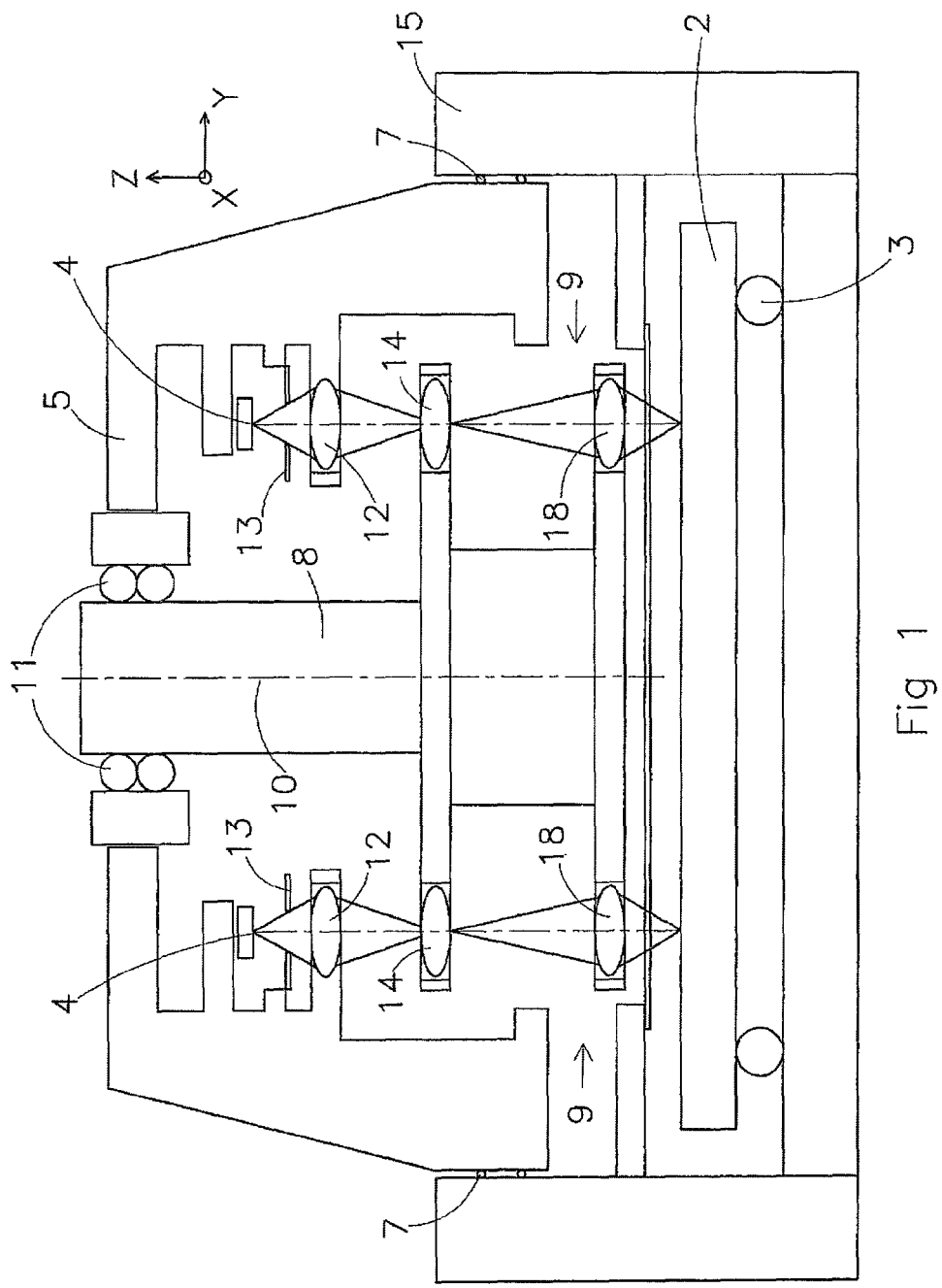
FIG. 1 depicts a part of a lithographic apparatus according to an embodiment of the invention.

FIG. 1 schematically depicts a schematic cross-sectional side view of a part of a lithographic apparatus. In this embodiment, the lithographic apparatus has individually controllable elements substantially stationary in the X-Y plane as discussed further below although it need not be the case. The lithographic apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the lithographic apparatus is suitable for roll-to-roll manufacturing.

The lithographic apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
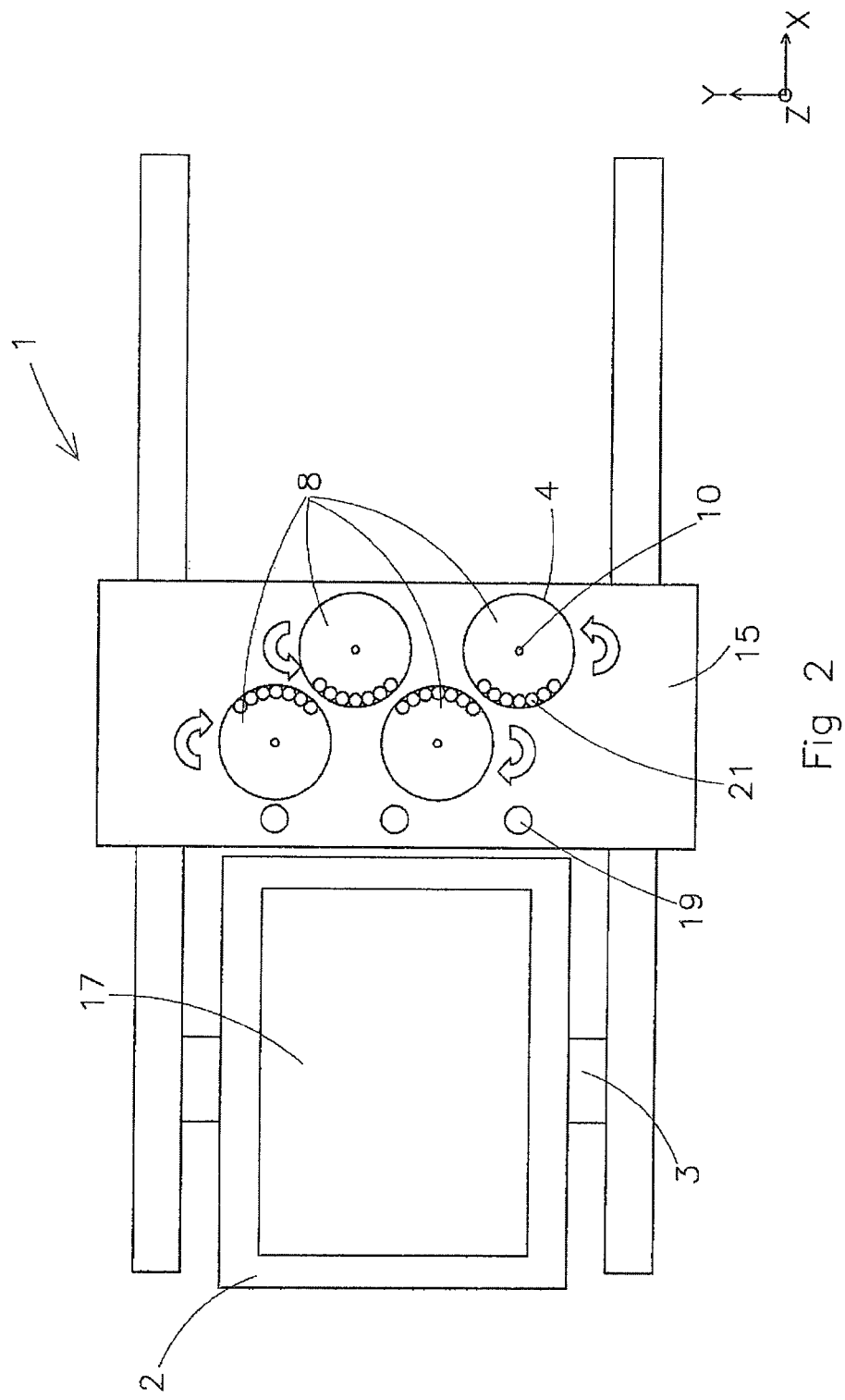
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the lithographic apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The lithographic apparatus 1 may comprise an actuator (e.g. motor 11) to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator e.g. motor 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the lithographic apparatus of FIG. 1 having self-emissive contrast devices 4. Like the lithographic apparatus 1 shown in FIG. 1, the lithographic apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
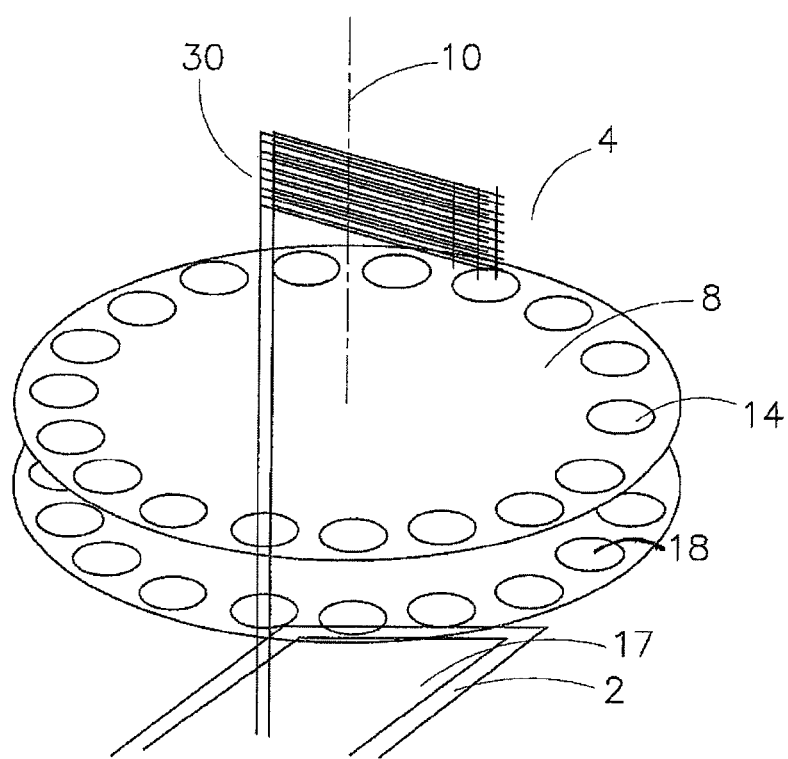
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
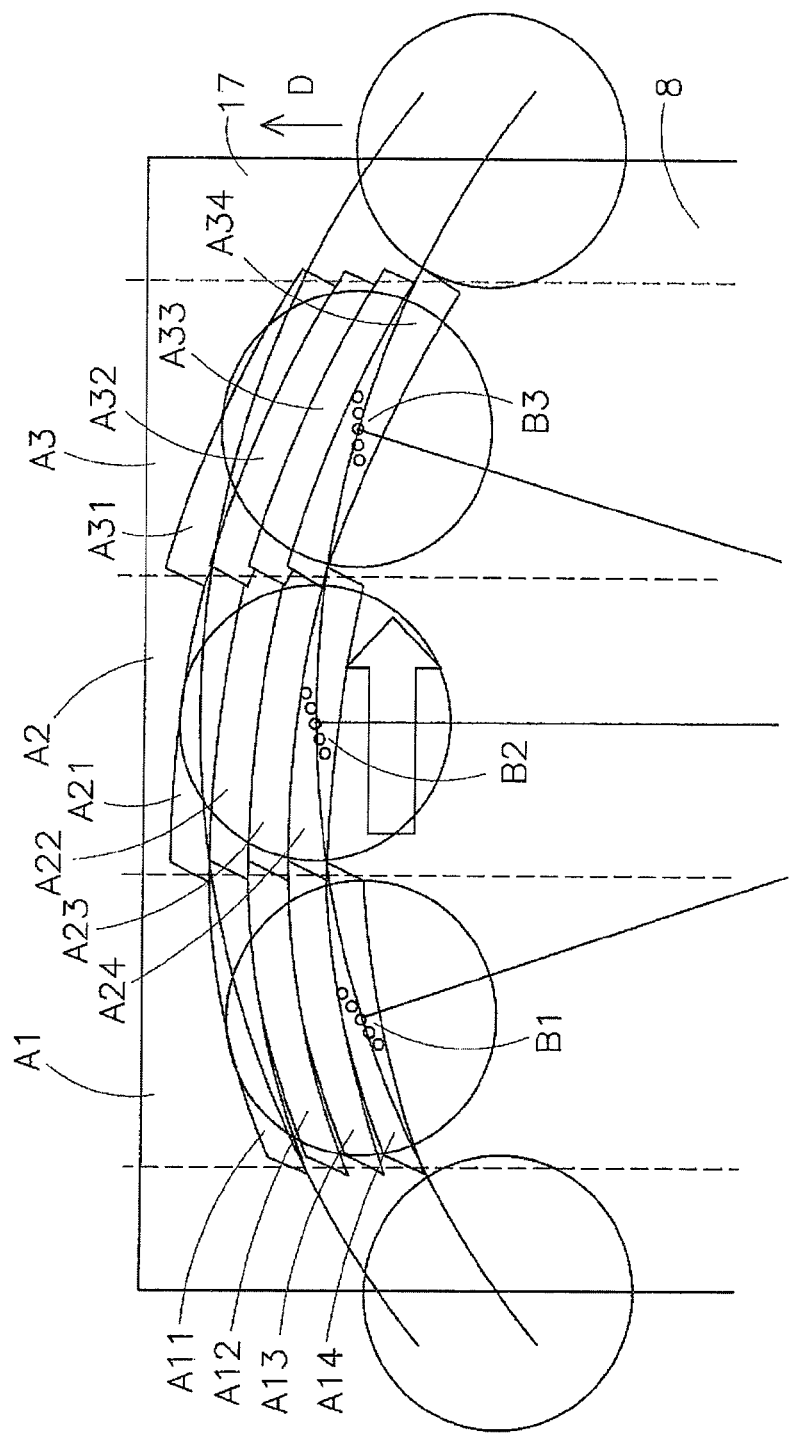
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beams are incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2, thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, resulting in areas A21, A22, A23 and A24 (areas A21, A22, A23 being previously scanned and A24 being currently scanned as shown in FIG. 4) for each successive scan of beams B2 and resulting in areas A31, A32, A33 and A34 (areas A31, A32, A33 being previously scanned and A34 being currently scanned as shown in FIG. 4) for each successive scan of beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the lithographic apparatus may be arranged to operate the second actuator so as to move the substrate with respect to the optical column to have a following projection of the beam to be projected in the spacing.

In order to reduce a distance between successive beams in a group in the direction D shown in FIG. 4 (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In order to reduce the effect of a pointing error of a beam of radiation that projects a spot of radiation onto the substrate in order to form an image, as discussed above, the lithographic apparatus may be configured to adjust one or more parameters of the lithographic process, such as the timing of pluses of the beam of radiation used to form a spot on the substrate, the position of the substrate relative to the projection system and/or the position of a moving component of the projection system.

In an embodiment, in order to provide such a compensation system, the corrections to be made are determined. Accordingly, in an embodiment of the present invention, there is provided a system to determine the position of a spot of radiation projected onto the substrate. The data from such a system may not only enable compensation for pointing errors of the beams of radiation used to provide the spots of radiation on the substrate but also may be used to compensate for an error introduced by the timing of the relative movement between the substrate and the projection system and/or an error introduced by a timing error of the pulses of the beams of radiation and/or an error introduced by mistiming of movement of any moving components within the projection system, as discussed above.

Accordingly, in an embodiment of the invention, a radiation spot measurement system is provided to determine the position of a spot of radiation relative to an intended position. The determination may be made for a temporarily stationary spot of radiation or may be made for a spot of radiation that is arranged to be scanned across a substrate, for example. In the latter case, the system may determine the actual scanning of the spot of radiation relative to the intended scanning of the spot of radiation, for example determining the actual position of the spot of radiation relative to the intended position of the spot of radiation instantaneously at one or more instances during the scanning process.

Figure 5:
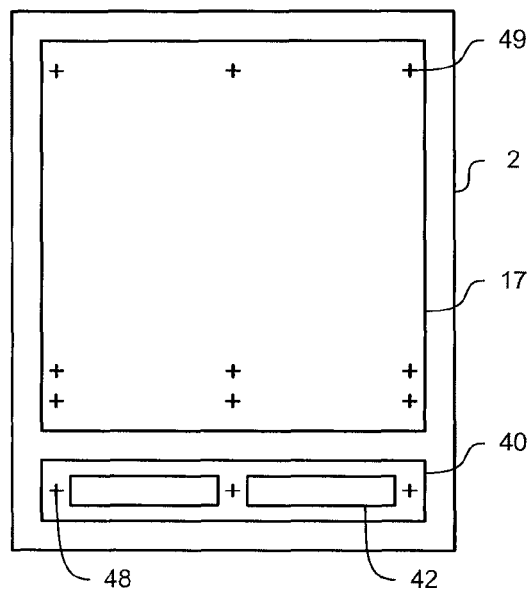
FIGS. 5 and 6 depict, in plan view and cross-section respectively, an arrangement of a radiation spot measurement system according to an embodiment of the present invention.
Figure 6:
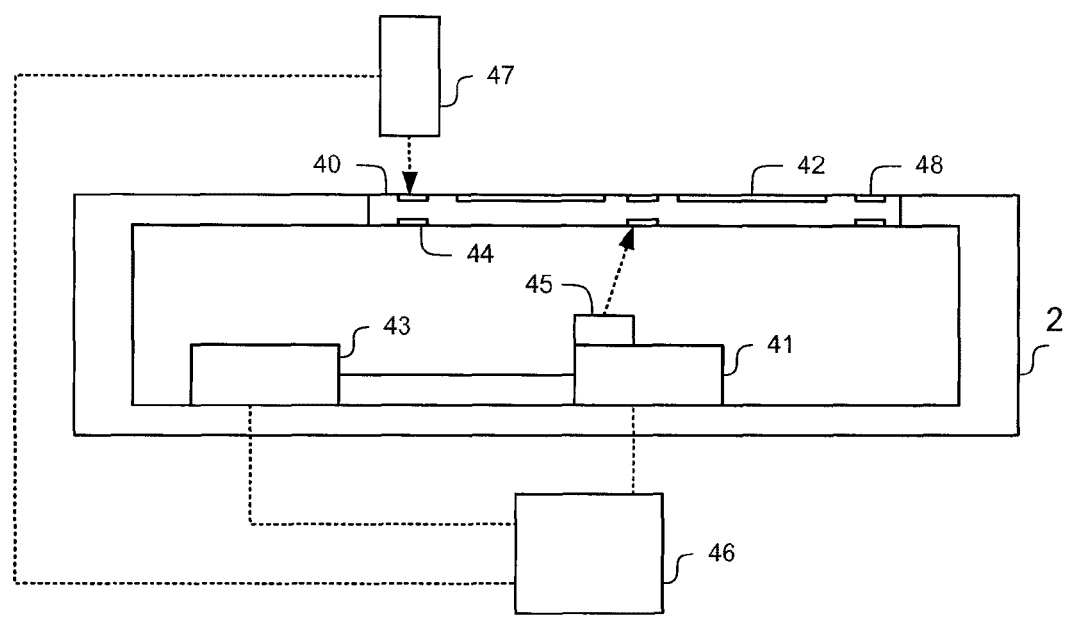

FIGS. 5 and 6 depict an arrangement of a radiation spot measurement system according to an embodiment of the present invention. As shown, the radiation spot measurement system comprises a target plate 40 and a radiation detector 41. The target plate 40 may be mounted to the substrate table 2, which is configured to support a substrate 17. The target plate 40 may, for example, be mounted to an upper surface of the substrate table 2 such that the upper surface of the target plate 40 is substantially parallel to the upper surface of a substrate 17 supported on the substrate table 2.

In an additional or alternative arrangement, the target plate 40 may be mounted to a separate table. In such an arrangement, radiation spot measurements may be performed at the same time as other processes within the lithographic apparatus, such as loading/unloading a substrate to/from a substrate table.

As depicted in FIG. 5, the target plate 40 may be elongate. In such an arrangement, the target plate may be arranged to extend along one side of the substrate table 2. This may be beneficial for an arrangement of a lithographic apparatus as discussed above, in which a plurality of optical columns may be provided in order to enable the formation of patterns across the full width of a substrate 17 during a single pass of the substrate 17 relative to the one or more optical columns. In this case, the target plate 40 may also extend across the full width of the one or more optical columns. Accordingly, measurement of the position of all of the spots of radiation generated by the one or more optical columns may be performed in a single pass of the target plate 40 relative to the one or more optical columns.

The target plate 40 comprises one or more measurement targets 42 onto which the spots of radiation may be projected in order to perform a spot measurement process. In particular, in an arrangement of the target plate 40 that is elongate and extending along one side of the substrate table 2, a plurality of measurement targets 42 may be distributed along the target plate in the elongate direction.

The radiation detector 41 may be arranged such that it detects radiation from one of the spots of radiation that has been projected onto one of the measurement targets 42. For example, as depicted in FIG. 6, the target plate 40 may be transmissive, in which case the radiation detector 41 is arranged on the opposite side of the target plate 40 from the projection system. Accordingly, the radiation detector 41 may detect radiation from a spot of radiation that has been projected onto one of the measurement targets 42 and transmitted through the target plate 40.

In an embodiment, a reflective target plate 40 may be provided. In such an arrangement, the one or more measurement targets 42 may be configured to reflect radiation from the spot of radiation projected onto the measurement target. In that case, the radiation detector 41 may be arranged on the same side of the target plate 40 as the projection system. In an embodiment, the radiation detector 41 may be mounted to or integral with the projection system. In an arrangement of the lithographic apparatus having a plurality of optical columns, a radiation detector may be provided as part of each of the optical columns.

As depicted in FIG. 6, an actuator system 43 may be provided and arranged to move the radiation detector 41 relative to the target plate 40. Accordingly, the radiation detector 41 may be moved to a plurality of different positions in order to detect radiation from a spot of radiation that has been projected onto a corresponding plurality of different measurement targets 42. Accordingly, a single radiation detector 41 may be used in conjunction with each of the measurement targets 42 of the target plate 40 in order to inspect each of the spots of radiation provided by the projection system.

Alternatively, a plurality of radiation detectors 41, which may each be associated with a respective actuator system 43, enabling multiple spots of radiation to be subjected to a spot measurement process simultaneously. In an arrangement having a plurality of optical columns, a radiation detector 41 and associated actuator system 43 may be provided for each of the optical columns.

Alternatively or additionally, the one or more actuator systems 43 of the radiation spot measurement system may be configured to control the position of a plurality of radiation detectors 41. For example, a plurality of radiation detectors 41 may be mounted to a common platform and an actuator system 43 may be configured to control the position of the platform.

In an arrangement, a radiation detector 41 may be arranged such that it can receive radiation from a plurality of measurement targets. Accordingly, a spot of radiation may be scanned across a plurality of measurement targets, for example in a single scan, and spot position information obtained for each. This may provide additional information concerning the cause of any deviation in spot location.

In an arrangement, one or more radiation detectors 41 may be provided at a respective fixed location relative to the target plate 40. Such one or more fixed radiation detectors 41, may each be configured to receive radiation from one or more measurement targets 42.

In order to determine the position of the radiation detector 41 relative to the target plate 40, for example in an arrangement in which the position of the radiation detector 41 can be controlled by an actuator system 43, the target plate 40 may include a plurality of radiation detector alignment markers 44. The lithographic apparatus may further include a radiation detector alignment marker inspection system, which is configured to use the one or more radiation detector alignment markers 44 in order to determine the position of the radiation detector 41 relative to the target plate 40.

In an arrangement, an illumination system 45 may be provided to illuminate the one or more radiation detector alignment markers 44 and the radiation detector 41 may be configured to identify the radiation reflected by the one or more radiation detector alignment markers 44 in order to identify the position of the radiation detector 41 relative to the target plate 40. As shown, the illumination system 45 may be provided with the radiation detector 41 such that the position of the illumination system 45 can be controlled by an actuator system 43 used to control the position of the radiation detector 41. In an alternative arrangement, the illumination system may be provided in a fixed position relative to the target plate 40.

A controller 46 may be provided in order to determine the position of the spot of radiation. In particular, the controller 46 of the radiation spot measurement system may, as described in further detail below, use information from the radiation detector 41 to determine the position of the spot of radiation. The controller 46 may also use information from the radiation detector alignment marker inspection system, which, as described above, may include additional information from the radiation detector 41, in order to determine the position of the spot of radiation relative to the target plate 40. In an arrangement, the controller may be configured to use information from inspecting the radiation detection alignment markers in order to assess and, if necessary, compensate for the deformation of any optical system of the radiation detector 41.

The controller 46 may also receive information from an alignment inspection system 47, which is configured to inspect one or more target plate alignment markers 48 provided on the target plate 40. The alignment inspection system may, for example, provide information concerning the position of the target plate 40 relative to an element in the lithographic apparatus, for example the projection system. Alternatively or additionally, the alignment inspection system 47 may be configured to inspect one or more alignment markers 49 provided on the substrate 17. Accordingly, the alignment inspection system may be configured to provide information concerning the position of the target plate 40 relative to the substrate 17.

Although, in FIG. 6, radiation detector alignment markers 44 are provided in similar positions on the target plate 40 to target plate alignment markers 48, this need not be the case. In general, the position of the two sets of markers 44, 48 may be selected independently.

The provision of information concerning the position of the target plate 40 to the controller 46 may enable the controller 46 to calculate the position of a spot of radiation that is the subject of a spot measurement process relative to the intended position of the spot of radiation in a plane that is substantially parallel to an upper surface of the target plate 40. By calculating such a difference between the actual position of the spot of radiation and the intended position of the spot of radiation when it is projected onto the target plate 40, the lithographic apparatus may compensate, in a feedback or feedforward basis, for the deviation when the spot of radiation is projected onto the substrate 17 during the formation of a pattern on the substrate 17.

The controller 46 of the radiation spot measurement system, used to determine the position of the spot of radiation relative to an intended position of the spot of radiation, may be separate from, or part of, a controller used to control the operation of the lithographic apparatus. The controller 46 may be used to control the actuator system 43 to control the position of the radiation detector. Alternatively or additionally, a separate controller may be provided for the actuator system 43.

In an embodiment of a radiation spot measurement system, the measurement target 42 may comprise a window that is configured to permit an image of the spot of radiation to be directed to the radiation detector when the spot is projected onto the window. For example, in the case of a transmissive target plate 40, the window may be a transparent section. For a reflective target plate 40, the window may be a plane reflector.

In such an arrangement, the radiation detector may comprise an image sensor that is configured to acquire an image that includes an image of the spot of radiation. In that case, the controller 46 may determine the position of the spot of radiation relative to an intended position of the spot of radiation based on the position of the image of the spot in the field of view of the image sensor.

Figure 7:
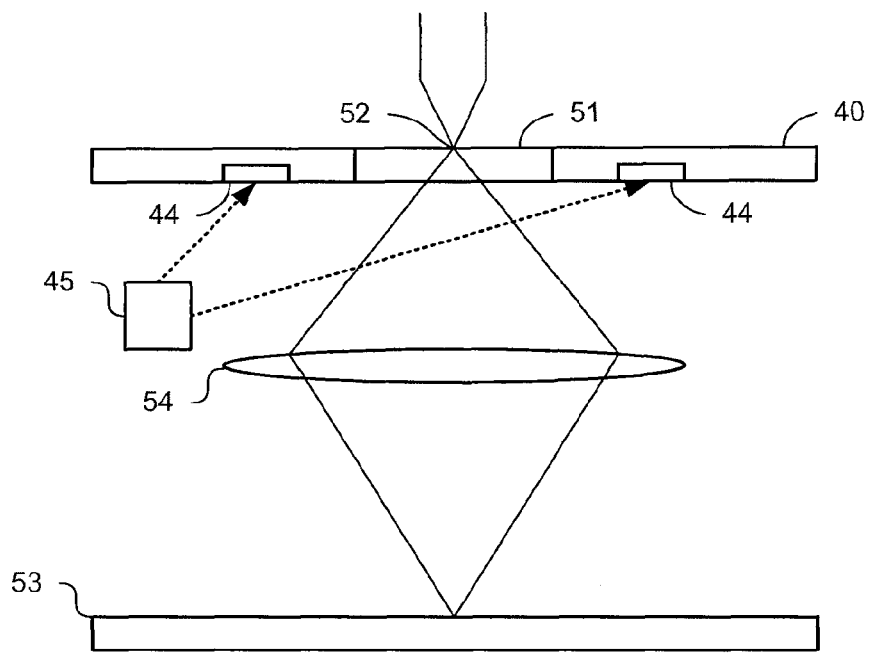
FIG. 7 depicts a part of an arrangement of a spot measurement system according to an embodiment of the present invention.

FIG. 7 depicts an arrangement of a radiation spot measurement system of the type discussed above. As shown, the target plate 40 includes a window 51 onto which the spot 52 of radiation may be projected. In the arrangement shown, the target plate 40 is transmissive. Accordingly, when the spot 52 of radiation is projected onto the window 51, it is transmitted through the target plate 40. The radiation detector comprises an image sensor 53, which may be, for example, a CCD detector. Other image sensors may be used. A lens or lens system 54 may be provided to project the image of the spot 52 of radiation onto the image sensor 53.

Figure 8:
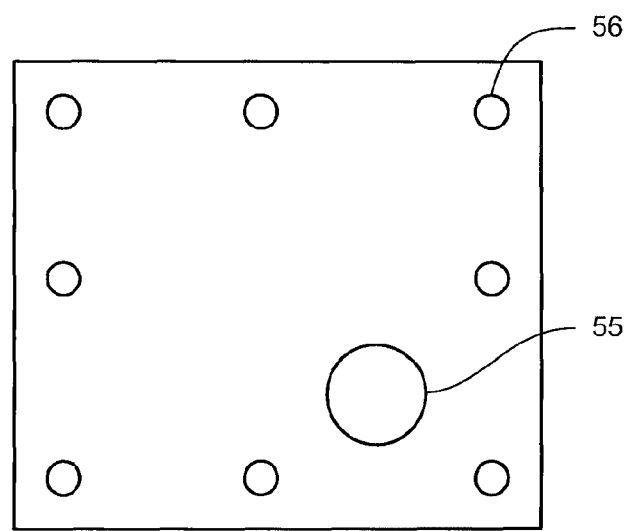
FIG. 8 depicts an image that may be formed in an image sensor during use of an arrangement as depicted in FIG. 7.

FIG. 8 depicts an example of an image that may be detected by the image sensor 53 during a spot measurement process. As shown, an image 55 of the spot 52 of radiation is located within the field of view of the image sensor 53. The controller may determine the position of the spot 52 of radiation relative to an intended position of the spot of radiation based on the position of the image 55 of the spot 52 of radiation within the field of view of the image sensor 53.

As shown in FIG. 7, and as discussed above, the target plate 40 may be provided with one or more radiation detector alignment markers 44, together with an associated illumination system 45 to illuminate the radiation detector alignment markers 44. Accordingly, an image 56 of each of the radiation detector alignment markers 44 may also be projected onto the image sensor 53, resulting in the images 56 of the radiation detector alignment markers 44 being visible in the field of view of the image sensor 53, as shown in FIG. 8.

The controller 46 may be configured to determine the position of the spot of radiation relative to an intended position of the spot of radiation based on the position of the image 55 of the spot 52 of radiation relative to the position of the images 56 of the radiation detector alignment markers 44 within the field of view of the image sensor 53.

In an arrangement, the beam of radiation providing the spot 52 of radiation projected onto the target plate 40 may be pulsed. Accordingly, the image sensor 53 may be configured to form the image 55 of the spot 52 of radiation from a single pulse of the system.

Alternatively, the image sensor 53 may integrate a plurality of pulses of the radiation system to form the image 55 of the spot 52 of radiation.

In an arrangement in which the beam of radiation providing the spot 52 of radiation is moving relative to the target plate 40, as discussed above and/or an arrangement in which the detector 41 is moving relative to the target plate 40, the use of a plurality of pulses of the radiation system may not significantly affect the quality of the image 55 of the spot 52 of radiation formed within the field of view of the image sensor 53. This is because the pulses of the radiation system may be very short, for example of the order of 10 ns. Accordingly, the movement of the image 55 of the spot 52 of radiation within the field of view of the image sensor 53 over a limited number of pulses of the radiation system may be relatively small.

The use of one or more such relatively short pulses may be possible due to the relatively high intensity of the beam of radiation used to form the spot 52 of radiation projected onto the target plate 40. However, it may be desirable not to use such a high intensity of radiation to illuminate the radiation detector alignment markers 44. Accordingly, the illumination system 45 for the radiation detector alignment markers 44 may illuminate the radiation detector alignment markers 44 for a time period that is equivalent to a plurality of pulses of the radiation system providing the spot 52 of radiation projected onto the target plate 40.

The illumination of the radiation detector alignment markers 44 may take place at the same time as the one or more pulses of the radiation system providing the spot 52 of radiation are projected onto target plate 40. Alternatively, the illumination of the radiation detector alignment markers 44 may take place shortly before or shortly after the one or more pulses of the radiation system. In the latter case, it may be desirable to ensure that the time difference between the period of illumination of the radiation detector alignment markers 44 and the one or more pulses of the radiation system is reduced or minimized. This may reduce or minimize the effect on the accuracy of the determination of the position of the spot of radiation 52 relative to an intended position of the spot of radiation caused by movement of the images 56 of the radiation detector alignment markers 44 relative to the image 55 of the radiation spot 52 within the field of view of the image sensor 53.

The image sensor 53 may also be used to provide data concerning the shape of the spot 52 of radiation projected onto the target plate 40 because this will be reflected in the shape of the image 55 of the spot 52 of radiation provided within the field of view of the image sensor 53.

Although FIGS. 7 and 8 depict an arrangement of the radiation spot measurement system in which a single spot 52 of radiation is projected onto the image sensor 53 at a single instant, this need not be the case. Accordingly, for example, the image sensor 53 may be configured such that a plurality of spots of radiation may be projected onto corresponding windows 51 formed on the target plate 40 and projected onto the image sensor 53 simultaneously. Such an arrangement may provide a plurality of images of the associated spots of radiation simultaneously within the field of view of the image sensor. Correspondingly, the controller 46 may be configured to determine the position of each of the spots of radiation relative to their respective intended positions.

Figure 9:
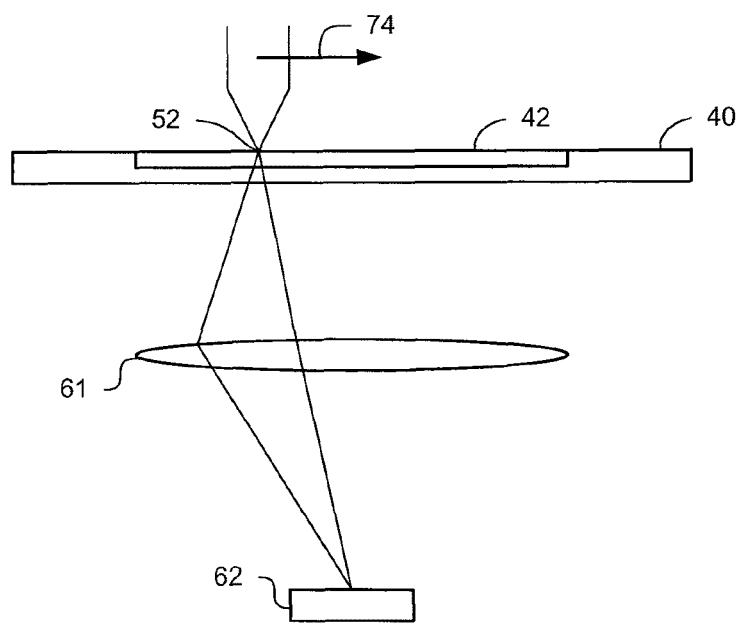
FIG. 9 depicts a part of an arrangement of a radiation spot measurement system according to an embodiment of the invention.

FIG. 9 depicts an arrangement of a spot measurement system that may be used in a further embodiment of the invention. The arrangement depicted uses a transmissive target plate 40 but the arrangement may also be adapted for a reflective target plate 40.

As shown in FIG. 9, the spot 52 of radiation is projected onto the measurement target 42 and scanned across the measurement target 42. As is described further below, radiation from the spot 52 passes through the measurement target 42 and may be directed by an appropriate lens system 61 to a radiation intensity detector 62 that may be configured to respond to the total intensity of the radiation from the spot 52 that passes through the measurement target 42 at each part of the measurement target 42 on which the spot 52 of radiation is projected. The radiation intensity sensor 62 may, in particular, be an integrating photodiode or other appropriate radiation intensity sensor.

Although not depicted in FIG. 9, in an arrangement, the radiation intensity detector 62 and any associated lens system 61 may be configured to receive radiation from a plurality of measurement targets 42. Accordingly, the spot 52 of radiation may be scanned across a plurality of measurement targets 42 successively providing additional position information, as discussed above.

Figure 10:
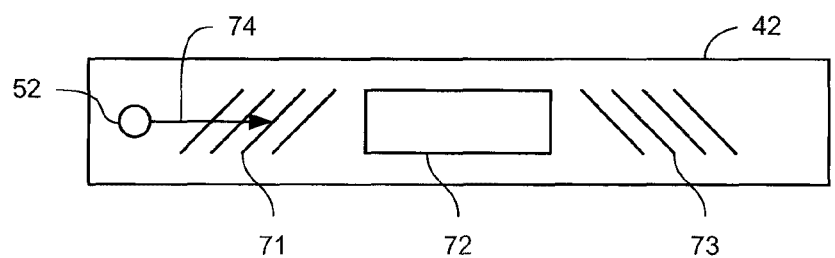
FIGS. 10, 11 and 12 depict measurement targets of different embodiments of the invention that may be used with the arrangement depicted in FIG. 9.

FIG. 10 depicts an arrangement of a measurement target 42 that may be used with a spot measurement system as depicted in FIG. 9. As shown, the measurement target 42 comprises first, second and third sections 71, 72, 73.

The first and third sections, 71, 73 of the measurement target 42 are formed from gratings and the second section 72 is formed from a window that, in the case of a transmissive target plate 40, transmits the radiation from the spot of radiation 52 to the radiation intensity sensor 62 in an unmodulated form, namely the transmissive, or reflective, characteristics of the window are independent of the position within the window on which the spot 52 of radiation is incident.

In this arrangement, the controller 46 of the spot measurement system is configured to control the radiation system providing the spot 52 of radiation such that the intensity of the spot of radiation is substantially constant while it scans across the first and third sections 71, 73 of the measurement target 42 but has a varying intensity at a reference position that is timed to be only during the time period when the spot 52 of radiation is projected onto the second section 72 of the measurement target 42. In other words, it may be timed to ensure that the varying intensity is not used when the spot of radiation 52 crosses the edges of the second section 72 of the measurement target 42.

As discussed above, the radiation may be pulsed. In that case, references to the beam of radiation having a constant intensity should be understood to mean that the intensity of the pulses are the same. Similarly, references to the intensity of the beam of radiation varying are intended to mean that the intensity of the pulses vary.

Therefore, the radiation intensity sensor 62 receives first, second and third signals as the spot 52 of radiation scans across the measurement target 42, corresponding to the first, second and third sections 71, 72, 73 of the measurement target 42. The first and third signals will have a varying intensity as a result of the substantially constant intensity spot 52 of radiation scanning across the two gratings forming the first and third sections 71, 73 of the measurement target 42. The second signal is also a varying intensity signal as a result of the varying intensity of the spot 52 of radiation projected onto the target plate 40 at a reference position when the spot 52 of radiation is projected through the window forming the second section 72 of the measurement target 42.

The controller 46 of the radiation spot measurement system may determine the position of the spot 52 of radiation as it scans across the measurement target 42 relative to the intended position of the spot 52 of radiation. In other words, the controller 46 may determine the difference between an intended trajectory and timing of the scanning of the spot of radiation across the measurement target 42 relative to the actual trajectory and timing. From this, for example, the radiation beam pointing error of the radiation beam producing the spot 52 of radiation may be determined.

In particular, the deviation between the intended and actual position of the spot 52 of radiation in a direction 74 parallel to the direction of scanning of the spot 52 of radiation across the measurement target 42 may be determined from the time difference and the phase difference between the first and second signals and the time difference and the phase difference between the second and third signals. For example, if the position of the spot 52 of radiation is deviated in a direction towards the first section 71 of the measurement target and away from the third section 73 of the measurement target, the second signal will be closer in time to the first signal than the third signal and the phase difference between the signals may change. Accordingly, by appropriate calibration, the timing of the signals and their phase difference can be used to determine the spot position. The time difference between the signals may provide a position measurement to a first degree of accuracy, namely a coarse position measurement, and the phase difference may provide an improved accuracy of position measurement, namely a fine position measurement.

As depicted in FIG. 10, the gratings forming the first and third sections 71, 73 of the measurement target 42 may be formed at different respective oblique angles to the direction 74 of scanning of the spot 52 of radiation across the measurement target 42. Accordingly, deviation of the spot 52 of radiation in a direction substantially perpendicular to the scanning direction 74 of the spot of radiation across the measurement target 42 results in a difference in the timing and phase of the first and third signals resulting from the spot 52 of radiation passing across the first and third sections 71, 73 of the measurement target 42.

In the arrangement depicted in FIG. 10, the gratings forming the first and third section 71, 73 of the measurement target 42 are both arranged at approximately 45° to the direction 74 of scanning of the spot 52 of radiation across the measurement target 42 but at opposite inclinations. Consequently, using appropriate calibration, the controller 46 of the radiation spot measurement system may determine the position, in a direction substantially perpendicular to the scanning direction 74 of the spot 52 of radiation, of the spot 52 of radiation as it scans across the measurement target 42 by an analysis of the time and phase difference between the first and third signals. For example, in the arrangement depicted in FIG. 10, if the position of the spot 52 of radiation is deviated toward to the top of the page, the time difference between the first and third signals decreases.

Although in the arrangement depicted in FIG. 10, the second section 72 of the measurement target 42 is arranged between the first and third sections 71,73, this arrangement may be different.

Figure 11:
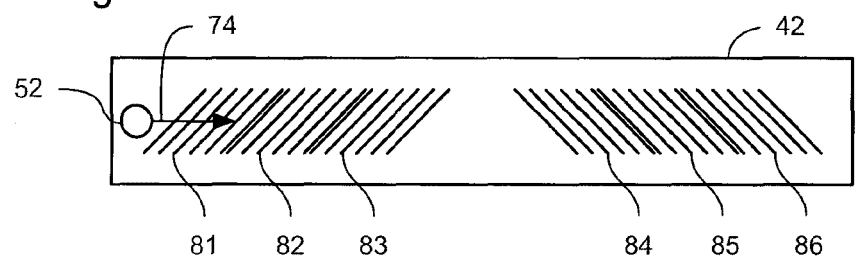

FIG. 11 depicts a further arrangement of a measurement target 42 that may be used with a spot measurement system as depicted in FIG. 9.

As shown, the measurement target 42 of this embodiment comprises first to third sections 81, 82, 83 arranged in a first group such that, as the spot 52 of radiation scans across the measurement target 42, it scans across the first to third sections 81, 82, 83. As shown, the first, second and third sections 81, 82, 83 of the measurement target 42 are each formed from a respective grating. Each of the gratings has the same pitch.

The controller 46 of the radiation spot measurement system using the measurement target 42 depicted in FIG. 11 is configured to control the radiation system such that the intensity of the beam of radiation providing the spot 52 of radiation on the target plate 40 varies in a similar manner to that discussed above when the spot 52 of radiation is projected onto the second section 72 of the measurement target 42 depicted in FIG. 10. However, when used in conjunction with the measurement target 42 depicted in FIG. 11, the beam of radiation is controlled to have a varying intensity for the entire time period during which the spot 52 of radiation is scanned across the measurement target 42.

As discussed above in relation to the measurement target depicted in FIG. 10, if a substantially constant intensity spot 52 of radiation were scanned across each of the gratings forming the sections 81, 82, 83 of the measurement target 42, the resulting radiation intensity detected by the radiation intensity sensor 62 would be a varying signal. However, in the present arrangement, the intensity of the spot 52 of radiation also varies. By setting the speed at which the spot 52 of radiation scans relative to the measurement target 42 appropriately relative to the pitch of the gratings forming the first to third sections 81, 82, 83 of the measurement target 42, the frequency of modulation caused by scanning the spot 52 of radiation over the gratings may be set to be similar to the frequency at which the intensity of the beam of radiation providing the spot 52 of radiation varies. In such an arrangement, the signal from the radiation intensity sensor 62, corresponding to the intensity of radiation received at the radiation intensity sensor 62 resulting from the modulation of the varying signal, includes a low frequency component, close to DC. The signal strength of this signal component depends on the relative phase between the modulation induced by the grating on which the spot of radiation is projected and the modulation of the variation of the intensity of the radiation beam. The signal from the radiation intensity sensor 62 may also include one or more relatively high frequency components. A filter algorithm may be provided to suppress the high frequency component(s).

By arranging the gratings of the first to third sections 81, 82, 83 of the measurement target 42 such that each is separated from an adjacent section by an amount that differs from the pitch of the gratings, the modulation effected by the gratings forming each of the first to third sections 81, 82, 83 of the measurement target 42 are out of phase with respect to each other. As a result, the signal level of the low frequency component output by the radiation intensity sensor 62 may differ when the spot 52 of radiation scans across the first to third sections 81, 82, 83 of the measurement target 42.

Therefore, at the transition from a first section 81 to a second section 82 of the measurement target 42 and/or at the transition from a second section 82 to a third section 83 of the measurement target, the signal level of the low frequency component output from the radiation intensity sensor 62 will change. Determination of this transition point by the controller 46 of the radiation spot measurement system enables the radiation spot measurement system to determine the approximate position of the spot 52 of radiation relative to its intended position as it scans across the measurement target 42 in the direction 74 parallel to the direction of scanning of the spot 52 of radiation. In particular, the timing of the transition may be used to determine the position of the spot 52 of radiation relative to its intended position to a precision of less than the pitch of the gratings. A more precise determination of the position of the spot 52 of radiation relative to its intended position, namely the position within a range defined by the timing-based measurement that is less than the pitch of the grating, may be determined from the signal level of the low frequency component of signal output from the radiation intensity sensor 62, for example using appropriate calibration.

The absolute value of the signal level of the low frequency component output from the radiation intensity 62 may depend on additional factors other than the relative phase of the modulation of the intensity of the beam of radiation and the modulation effected by the gratings. However, such other factors may be eliminated by analysis of the signal level of the low frequency component output from the radiation intensity sensor 62 for the three different sections 81, 82, 83 of the measurement target 42.

Depending on the absolute position of the measurement target 42, the position of one of the transitions between two sections 81, 82, 83 of the measurement target 42 may be such that the intensity of the low frequency component of the resulting signal from the radiation intensity sensor 62 is the same for both sections of the measurement target 42. This may occur if the phase difference for each, relative to the modulation of the beam of radiation, is equally spaced on either side of a particular phase difference at which a peak signal of the low frequency component from the radiation intensity sensor 62 is observed. In this case, no transition between the signals associated with the two sections 81, 82, 83 of the measurement target 42 would be observed.

However, because three sections 81, 82, 83 of the measurement target 42 are provided, each formed from a grating that is out of phase with the others, it can be ensured that there is a step change in the signal intensity from the radiation intensity sensor 62 during at least one transition as the spot 52 of radiation scans across the three sections 81, 82, 83 of the measurement target 42. In a particular arrangement, the grating of the second section 82 of the measurement target 42 may be 45° out of phase with the first and third sections 81, 83 of the measurement target 42, arranged on either side. Therefore, the ability to perform the coarse position measurement based on the timing of at least one transition can be ensured. This may be desired because the fine position measurement based on the signal level of the low frequency component output from the radiation intensity sensor may not determine the absolute position beyond a range corresponding to the pitch of the grating.

As shown in FIG. 11, in order to determine the position of the spot 52 of radiation in a direction substantially perpendicular to the direction 74 of scanning of the spot 52 of radiation across the measurement target 42, a second group of sections 84, 85, 86 of the measurement target 42 may be provided. The second group of sections 84, 85, 86 of the measurement target 42 may correspond to the first group of sections 81, 82, 83 of the measurement target 42 but be arranged such that the gratings forming the second group are arranged at a different oblique angle to the direction 74 of scanning of the spot 52 of radiation from the gratings of the first group. For example, the gratings may be arranged at approximately 45° to the direction 74 of scanning of the spot of 52 of radiation but at opposite inclination to the gratings of the first group.

By means of such an arrangement, in a similar manner to that discussed above in respect of the measurement target 42 depicted in FIG. 10, the controller 46 of the radiation spot measurement system may determine the position of the spot 52 of radiation in the direction substantially perpendicular to the direction of scanning of the spot of radiation from the time difference between a transition associated with the first group and a transition associated with the second group for a coarse position measurement and from the signal levels of the low frequency components output from the radiation intensity sensor 62 for the fine position measurement. For example, if the spot 52 deviates in a direction towards the top of the page in the arrangement shown in FIG. 11, the position measured using the first group of sections 81, 82, 83 of the measurement target 42 and the position measured using the second group of sections 84, 85, 86 of the measurement target 42 will be closer together in time.

An advantage of a radiation spot measurement system using the measurement target 52 depicted in FIG. 11 compared to that of FIG. 10 is that the calculations to be performed by the controller 46 may be simpler. Furthermore, the radiation source may be continuously operated at a varying intensity rather than switching between a mode of operation at a continuous intensity and a mode of operation at a varying intensity at a specific time corresponding to a certain position of the spot of radiation, as discussed above.

Figure 12:
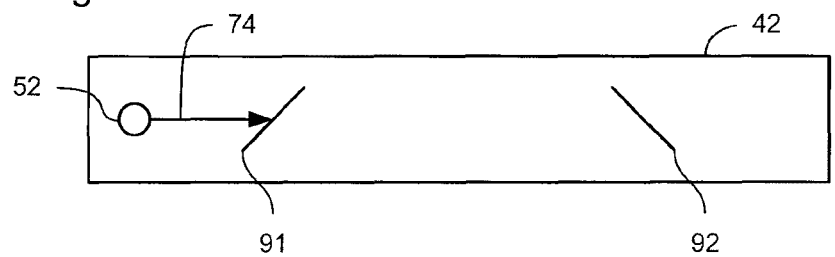

FIG. 12 depicts a further arrangement of a measurement target 42 that may be used with a radiation spot measurement system such as that depicted in FIG. 9. As shown, the measurement target 42 comprises at least a first slit 91 arranged such that the spot 52 of radiation scans across the slit 91. The slit 91 may be configured to be significantly narrower than the width of the spot 52 of radiation projected onto the target plate 40. Accordingly, as the spot 52 of radiation passes across the slit 91, at each instant a fraction of the area of the spot of radiation is directed to the radiation intensity sensor 62.

The controller 46 of the radiation spot measurement system may determine the position of the spot 52 of radiation relative to the intended position of the spot of radiation in the direction parallel to the direction 74 of scanning of the spot 52 of radiation across the measurement target 42 based on the intensity profile of the signal from the radiation intensity sensor 62 as the spot 52 of radiation is passed across the slit 91. Furthermore, the shape of the signal output from the radiation intensity sensor 62 may provide data indicative of the shape of the spot 52 of radiation projected onto the measurement target 42.

In an arrangement, the signal from the radiation intensity sensor 62 may be integrated as the spot 52 of radiation is passed across the slit 91. The integral may be reset between measurements.

As depicted in FIG. 12, the measurement target 42 may comprise at least a second slit 92. The first and second slits 91, 92 may be arranged at different respective oblique angles relative to the direction 74 of scanning of the spot 52 of radiation across the measurement target 42. Accordingly, as with the arrangements discussed above, the relative positions of the spot 52 of radiation at which it is determined to be traversing from the first to the second slits 91, 92 may enable the controller 46 of the radiation spot measurement system to determine the position of the spot 52 of the radiation in a direction substantially perpendicular to the direction of scanning 74 of the spot 52 of radiation across the measurement target 42. In particular, for the arrangement depicted in FIG. 12, if the spot 52 of radiation is deviated in a direction towards the top of the page, the signals associated with the spot 52 of radiation traversing the first and second slits 91, 92 would become closer together.

By providing a plurality of slits at different respective angles relative to the direction 74 of scanning of the spot 52 of radiation across the measurement target 42, as depicted in FIG. 12, additional information regarding the shape of the spot 52 of radiation may be obtained.

The information from the radiation spot measurement system as described above may be used to adjust one or more parameters of the lithographic apparatus during a subsequent process to project the beams of radiation onto a substrate, namely during a subsequent process performed as part of a device manufacturing method.

In accordance with a device manufacturing method, a device, such as a display, integrated circuit or any other item may be manufactured from the substrate on which the pattern has been projected.

From the description above and specifically the description with respect to FIG. 6 it will be clear that an advantage of using the actuator system 43 and radiation detector alignment marker inspection system as depicted in FIG. 6 is that the radiation detector 41 can be accurately positioned at different locations. This helps ensure that a single radiation detector 41 can detect radiation at different locations. This allows the use of less radiation detectors or even a single radiation detector 41 in case radiation has to be detected at different locations providing a cost advantage. Accordingly, in an embodiment of the invention there is provided a radiation detector system for a lithographic apparatus. The radiation detector system comprises a radiation detector 41 configured to detect radiation. The radiation detector system further comprises a substrate table 2 configured to support a substrate, wherein the radiation detector 41 is in or on the substrate table 2. The radiation detector system further comprises a radiation detector alignment marker 44 spatially fixed in relation to the substrate table 2 or in relation to the radiation detector 41. The radiation detector system further comprises a radiation detector alignment marker inspection system configured to inspect the radiation detector alignment marker 44 and determine the position of the radiation detector 41 relative to the substrate table 2 or an object, for example a target plate 40, fixed to the substrate table based on the inspection of the radiation detector alignment marker 44. The radiation detector system further comprises an actuator system 43 configured to control the position of the radiation detector 41 relative to the substrate table 2 or the object fixed to the substrate table, such that the radiation detector 41 can detect radiation at different positions.

According to an embodiment of the invention the radiation detector alignment marker inspection system may comprise an illumination system 45 configured to illuminate the radiation detector alignment marker 44. The radiation detector alignment marker inspection system may further comprise an illumination detector configured to detect radiation coming from the radiation detector alignment marker when illuminated.

In an embodiment, the illumination system 45 is spatially fixed in relation to the radiation detector 41 and the radiation detector alignment marker 44 is spatially fixed in relation to the substrate table 2 and the actuator system 43 is also configured to control the position of the illumination system 45 relative to the substrate table 2 or the object fixed to the substrate table. The radiation detector 41 may also be used as the illumination detector providing a cost advantage. However, the illumination detector may be different from the radiation detector 41 and be spatially fixed in relation to the radiation detector 41. Such a dedicated illumination detector may provide an improved detection of radiation coming from the radiation detector alignment marker when illuminated. In this case the actuator system 43 may be configured to control the position of the illumination detector relative to the substrate table 2 or the object fixed to the substrate table. According to an embodiment of the invention the radiation detector system comprises a plurality of radiation detector alignment markers spatially fixed in relation to the substrate table 2, wherein the radiation detector alignment marker inspection system is configured to inspect the plurality of radiation detector alignment markers to determine the position of the radiation detector 41 relative to the substrate table 2 or an object fixed to the substrate table based on the inspection of one or more of the radiation detector alignment markers. An advantage of using the plurality of radiation detector alignment markers is for example that it may extend the range where the position of the radiation detector 41 can be determined. Additionally or alternatively, it may improve the accuracy of the determination of the position of the radiation detector 41.

In an embodiment, the illumination system 45 is spatially fixed in relation to the substrate table 2 and the radiation detector alignment marker 44 is spatially fixed in relation to the radiation detector 41. In this case the actuator system 43 may be configured to control the position of the radiation detector alignment marker 44 relative to the substrate table 2 or the object fixed to the substrate table. The illumination detector may be spatially fixed in relation to the substrate table 2.

The radiation detector 41 may for example be a radiation intensity detector or an image sensor.

In an embodiment of the invention, a lithographic apparatus comprises the radiation detector system according to an embodiment of the invention described herein.

Further embodiments according to the invention are provided in below numbered clauses:

1. A lithographic apparatus, comprising:
a programmable patterning device, configured to provide a plurality of radiation beams;
a projection system, configured to project the plurality of radiation beams onto a substrate to form respective spots of radiation; and
a radiation spot measurement system, comprising:
a target, onto which the spots of radiation may be projected for a spot measurement process, the target comprising a measurement target;
a radiation detector, configured to detect radiation from one of the spots of radiation that has been projected onto the measurement target; and
a controller, configured to receive information from the radiation detector and, based on the information, to determine at least the position of the spot of radiation relative to an intended position of the spot of radiation on the target in a plane substantially parallel to an upper surface of the target.

2. The lithographic apparatus according to clause 1, further comprising a substrate table configured to support a substrate, wherein the target is in or on the substrate table.

3. The lithographic apparatus according to clause 2, wherein the substrate table comprises an upper surface configured to receive the substrate, and the target is in or on the upper surface of the substrate table adjacent a region configured to receive the substrate.

4. The lithographic apparatus according to clause 2 or clause 3, wherein the target is provided along one side of the substrate table, extending along the side for at least a part of the side corresponding to the width of a region on the substrate table configured to receive the substrate.

5. The lithographic apparatus according to any of the preceding clauses, wherein the target is elongate and comprises a plurality of the measurement targets, distributed along the target in its elongate direction.

6. The lithographic apparatus according to any of the preceding clauses, wherein the target further comprises a target alignment marker; and
the lithographic apparatus comprises an alignment inspection system configured to inspect the target alignment marker on the target and determine the position of the target relative to another element in the lithographic apparatus based on the inspection of the target alignment marker.

7. The lithographic apparatus according to clause 6, wherein the alignment inspection system is configured to inspect a substrate alignment marker provided on the substrate and to determine the position of the target relative to the substrate based on the inspection of the target alignment marker and the substrate alignment marker.

8. The lithographic apparatus according to any of the preceding clauses, comprising an actuator system configured to control the position of the radiation detector relative to the target such that, at different respective positions, it can detect radiation that has been projected onto different measurement targets on the target.

9. The lithographic apparatus according to clause 8, wherein the target further comprises a radiation detector alignment marker; and
the lithographic apparatus comprises a radiation detector alignment marker inspection system configured to inspect the radiation detector alignment marker and determine the position of the radiation detector relative to the target based on the inspection of the radiation detector alignment marker.

10. The lithographic apparatus according to clause 9, wherein the radiation detector alignment marker inspection system comprises the radiation detector and the controller.

11. The lithographic apparatus according to any of the preceding clauses, wherein the projection system comprises a moveable optical element and is configured such that, for a given position of a substrate or the target relative to the projection system, it can project each spot of radiation onto a plurality of locations on the substrate or target during the formation of an image on the substrate or the performance of a spot measurement process, respectively.

12. The lithographic apparatus according to clause 11, wherein the target, radiation detector and controller are configured to determine for a plurality of the locations, the position of the spot of radiation on the target relative to the corresponding intended position of the spot of radiation.

13. The lithographic apparatus according to any of the preceding clauses, wherein the projection system comprises a plurality of units, each to project a plurality of beams of radiation onto a substrate to form respective spots of radiation;
each of the units comprises a moveable optical element and is configured such that, for a given position of a substrate or target relative to the projection system, it can project each spot of radiation onto a plurality of locations on the substrate or target during the formation of an image on the substrate or the performance of a spot measurement process, respectively; and
the lithographic apparatus comprises a respective radiation detector associated with each of the units of the projection system, each configured to detect radiation from a spot of radiation from the corresponding unit that has been projected onto a measurement target.

14. The lithographic apparatus according to any of the preceding clauses, wherein the target comprises a transmissive measurement target, and the radiation detector is arranged on the opposite side of the target from the projection system.

15. The lithographic apparatus according to any of clauses 1-13, wherein the target comprises a reflective measurement target, and the radiation detector is mounted to the projection system.

16. The lithographic apparatus according to any of the preceding clauses, wherein the measurement target comprises a window to permit an image of the spot of radiation to be directed to the radiation detector when the spot is projected onto the window;
the radiation detector comprises an image sensor configured to acquire an image that includes an image of the spot of radiation; and
the controller is configured to determine the position of the spot of radiation relative to an intended position of the spot of radiation based on the position of the image of the spot of radiation in the field of view of the image sensor.

17. The lithographic apparatus according to clause 16 when dependent on clause 9 or clause 10, wherein the image acquired by the image sensor includes an image of the radiation detector alignment marker.

18. The lithographic apparatus according to clause 16 or clause 17, wherein the controller is configured to determine the shape of the spot of radiation based on the image of the spot of radiation acquired by the image sensor.

19. The lithographic apparatus according to any of clauses 1 to 15, wherein:
the measurement target comprises first, second and third sections, the first and third sections each comprise a grating and the second section comprises a window configured to permit the spot of radiation to be directed to the radiation detector;

the lithographic apparatus is configured such that the spot of radiation is projected onto the measurement target such that it scans across the first, second and third sections;

the radiation detector comprises a radiation intensity sensor configured to detect the intensity of radiation from the spot directed to the radiation detector from the measurement target; and the controller is configured to control the programmable patterning device such that the beam of radiation providing the spot of radiation has a substantially constant intensity when it scans across the first and third sections and has a varying intensity at a reference position when the spot of radiation scans across the second section, and to determine the position of the spot of radiation based on the timing and/or phase of first, second and third signals from the radiation detector that correspond to the spot of radiation being projected onto the first, second and third sections respectively.

20. The lithographic apparatus according to clause 19, wherein the controller is configured to determine the position of the spot of radiation relative to the intended position of the spot of radiation in a direction substantially parallel to the direction of scanning of the spot of radiation across the target based on a comparison of the time and/or the phase difference between the first and second signals and the second and third signals.

21. The lithographic apparatus according to clause 19 or clause 20, wherein the gratings of the first and third sections are provided at respective different oblique angles to the direction of scanning of the spot of radiation across the target; and the controller is configured to determine the position of the spot of radiation relative to the intended position of the spot of radiation in a direction substantially perpendicular to the direction of scanning of the spot of radiation across the target based on the time and/or phase difference between the first and third signals.

22. The lithographic apparatus according to any of clauses 1 to 15, wherein:

the measurement target comprises a plurality of sections, each section comprising a respective grating;

the lithographic apparatus is configured such that the spot of radiation is projected onto the measurement target such that it scans across the sections of the measurement target;

the radiation detector comprises a radiation intensity sensor configured to detect the intensity of radiation from the spot directed to the radiation detector from the measurement target;

the controller is configured to control the programmable patterning device such that the beam of radiation providing the spot of radiation has a varying intensity at a substantially constant frequency at the point at which it is projected onto the target; and the controller is configured to determine the position of the spot of radiation relative to an intended position of the spot of radiation based on respective signals from the radiation detector corresponding to the spot of radiation being projected at the plurality of sections of the measurement target.

23. The lithographic apparatus according to clause 22, wherein:

each of the gratings has the substantially same pitch when measured in a direction substantially parallel to the direction of scanning of the spot of radiation across the target;

a first group of the gratings comprises first, second and third gratings, corresponding to respective sections, arranged adjacent each other such that the first and second gratings and the second and third gratings are separated by a distance that is different from the pitch of the gratings in the direction substantially parallel to the direction of scanning of the spot of radiation across the target; and the controller is configured to determine a timing-based measurement of the position of the spot of radiation relative to the intended position of the spot of radiation in the direction substantially parallel to the direction of scanning of the spot of radiation across the target based on a timing at which the signal level from the radiation detector changes, corresponding to the time at which the spot of radiation passes from the first to the second section and/or the time at which the spot of radiation passes from the second to the third section.

24. The lithographic apparatus according to clause 22 or clause 23, wherein the controller is configured to determine an intensity-based measurement of the position of the spot of radiation relative to the intended position of the spot of radiation in the direction substantially parallel to the direction of scanning of the spot of radiation across the target based on the signal level of a low frequency component of a signal output by the radiation detector during a time when the spot of radiation is projected onto a grating.

25. The lithographic apparatus according to clause 24, wherein the intensity-based measurement of the position of the spot of radiation relative to the intended position of the spot of radiation is based on the signal level of the low frequency component of the signal output by the radiation detector during respective times when the spot of radiation is projected onto three different gratings.

26. The lithographic apparatus according to clause 24 or clause 25 when dependent from clause 23, wherein the timing-based measurement of position is used for a coarse position measurement and the intensity-based measurement of position is used for a fine position measurement.

27. The lithographic apparatus according to any of clauses 23-26, wherein:

the gratings include a second group of first, second and third gratings arranged in a corresponding manner to the first group of gratings, the gratings in the first and second groups are arranged at different respective oblique angles to the direction of scanning of the spot of radiation across the target; and the controller is configured to determine the position of the spot of radiation relative to the intended position of the spot of radiation in a direction substantially perpendicular to the direction of scanning of the spot of radiation across the target based on the difference between the timing-based measurement of position and/or the intensity-based measurement of position during the scan of the spot of radiation across the first group of gratings and during the scan of the spot of radiation across the second group of gratings.

28. The lithographic apparatus according to any of clauses 1-15, wherein:

the lithographic apparatus is configured such that the spot of radiation is projected onto the measurement target such that it is scanned across the measurement target;

the target comprises a slit configured to select a fraction of the area of the spot of radiation such that the fraction is directed to the radiation detector for each position of the spot of radiation relative to the measurement target; and the radiation detector comprises a radiation intensity sensor to detect the intensity of radiation from the spot directed to the radiation detector from the measurement target.

29. The lithographic apparatus according to clause 28, wherein the measurement target comprises at least first and second slits arranged such that, as the spot of radiation scans across the measurement target, it successively scans across each of the slits; and the first and second slits are arranged at respective different oblique angles to the direction of scanning of the spot of radiation across the target.

30. A method for measuring a radiation beam spot position in a lithographic apparatus that comprises a programmable patterning device to provide a plurality of radiation beams and a projection system to project the plurality of radiation beams onto a substrate to form respective spots of radiation, the method comprising:

projecting the spots of radiation onto a target comprising a measurement target;

using a radiation detector to detect radiation from one of the spots of radiation that has been projected onto the measurement target; and determining at least the position of the spot of radiation relative to an intended position of the spot of radiation in a plane substantially parallel to an upper surface of the target based on information from the radiation detector.

31. A device manufacturing method, comprising:

using the method of clause 30 to measure the radiation beam spot position of at least one of the plurality of radiation beams in the lithographic apparatus relative to a corresponding intended position; and using the determined spot position to control a parameter of the lithographic apparatus while projecting the plurality of beams of radiation onto a substrate.

32. A radiation detector system for a lithographic apparatus, comprising:

a radiation detector configured to detect radiation;

a substrate table configured to support a substrate, wherein the radiation detector is in or on the substrate table;

a radiation detector alignment marker spatially fixed in relation to the substrate table or in relation to the radiation detector;

a radiation detector alignment marker inspection system configured to inspect the radiation detector alignment marker and determine the position of the radiation detector relative to the substrate table or an object fixed to the substrate table based on the inspection of the radiation detector alignment marker; and an actuator system configured to control the position of the radiation detector relative to the substrate table or the object fixed to the substrate table, such that the radiation detector can detect radiation at different positions.

33. The radiation detector system according to clause 32, wherein the radiation detector alignment marker inspection system comprises an illumination system configured to illuminate the radiation detector alignment marker.

34. The radiation detector system according to clause 32 or clause 33, wherein the radiation detector alignment marker inspection system comprises an illumination detector configured to detect radiation coming from the radiation detector alignment marker when illuminated.

35. The radiation detector system according to clause 33 or clause 34, wherein the illumination system is spatially fixed in relation to the radiation detector, the radiation detector alignment marker is spatially fixed in relation to the substrate table, and the actuator system is configured to control the position of the illumination system relative to the substrate table or the object fixed to the substrate table.

36. The radiation detector system according to clause 34 or clause 35 when dependent on clause 34, wherein the radiation detector is used as the illumination detector.

37. The radiation detector system according to clause 34 or clause 35 when dependent on clause 34, wherein the illumination detector is different from the radiation detector and spatially fixed in relation to the radiation detector, and wherein the actuator system is configured to control the position of the illumination detector relative to the substrate table or the object fixed to the substrate table.

38. The radiation detector system according to clause 33 or clause 34, wherein the illumination system is spatially fixed in relation to the substrate table, the radiation detector alignment marker is spatially fixed in relation to the radiation detector, and the actuator system is configured to control the position of the radiation detector alignment marker relative to the substrate table or the object fixed to the substrate table.

39. The radiation detector system according to clause 38 when dependent on clause 34, wherein the illumination detector is spatially fixed in relation to the substrate table.

40. The radiation detector system according to any of clauses 35 to 37, comprising a plurality of radiation detector alignment markers spatially fixed in relation to the substrate table, wherein the radiation detector alignment marker inspection system is configured to inspect the plurality of radiation detector alignment markers to determine the position of the radiation detector relative to the substrate table or an object fixed to the substrate table based on the inspection of one or more of the radiation detector alignment markers.

41. The radiation detector system according to any of clauses 32 to 40, wherein the radiation detector is a radiation intensity detector or an image sensor.

42. A lithographic apparatus comprising the radiation detector system according to any of clauses 32 to 41.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a programmable patterning device, configured to provide a plurality of radiation beams;
a projection system, configured to project the plurality of radiation beams onto a substrate to form respective spots of radiation; and a radiation spot measurement system, comprising:
  a target, onto which the spots of radiation may be projected for a spot measurement process, the target comprising a plurality of measurement targets;
  a radiation detector, configured to detect radiation from one of the spots of radiation that has been projected onto the measurement target;
  an actuator system configured to control the position of the radiation detector relative to the plurality of measurement targets such that, at different respective positions, it can detect radiation that has been projected onto a different measurement target of the plurality of measurement targets; and
  a controller, configured to receive information from the radiation detector and, based on the information, to determine at least the position of the spot of radiation relative to an intended position of the spot of radiation on the target in a plane substantially parallel to a surface of the target.

2. The lithographic apparatus according to claim 1, further comprising a substrate table configured to support a substrate, wherein the target is in or on the substrate table.

3. The lithographic apparatus according to claim 1, wherein the target is elongate and the plurality of the measurement targets are distributed along the target in its elongate direction.

4. The lithographic apparatus according to claim 1, wherein the target further comprises a radiation detector alignment marker; and
  the lithographic apparatus comprises a radiation detector alignment marker inspection system configured to inspect the radiation detector alignment marker and determine the position of the radiation detector relative to the target based on the inspection of the radiation detector alignment marker.

5. The lithographic apparatus according to claim 1, wherein the projection system comprises a moveable optical element and is configured such that, for a given position of a substrate or the target relative to the projection system, it can project each spot of radiation onto a plurality of locations on the substrate or target during the formation of an image on the substrate or the performance of a spot measurement process, respectively.

6. The lithographic apparatus according to claim 5, wherein the target, radiation detector and controller are configured to determine for a plurality of the locations, the position of the spot of radiation on the target relative to the corresponding intended position of the spot of radiation.

7. The lithographic apparatus according to claim 1, wherein the projection system comprises a plurality of units, each to project a plurality of beams of radiation onto a substrate to form respective spots of radiation;
  each of the units comprises a moveable optical element and is configured such that, for a given position of a substrate or target relative to the projection system, it can project each spot of radiation onto a plurality of locations on the substrate or target during the formation of an image on the substrate or the performance of a spot measurement process, respectively; and
  the lithographic apparatus comprises a respective radiation detector associated with each of the units of the projection system, each configured to detect radiation from a spot of radiation from the corresponding unit that has been projected onto a measurement target.

8. The lithographic apparatus according to claim 1, wherein the target comprises a reflective measurement target, and the radiation detector is mounted to the projection system.

9. The lithographic apparatus according to claim 1, wherein the measurement target comprises a window to permit an image of the spot of radiation to be directed to the radiation detector when the spot is projected onto the window;
  the radiation detector comprises an image sensor configured to acquire an image that includes an image of the spot of radiation; and
  the controller is configured to determine the position of the spot of radiation relative to an intended position of the spot of radiation based on the position of the image of the spot of radiation in the field of view of the image sensor.

10. The lithographic apparatus according to claim 9, wherein the target further comprises a radiation detector alignment marker and wherein the image acquired by the image sensor includes an image of the radiation detector alignment marker.

11. The lithographic apparatus according to claim 9, wherein the controller is configured to determine the shape of the spot of radiation based on the image of the spot of radiation acquired by the image sensor.

12. The lithographic apparatus according to claim 1, wherein:
  the measurement target comprises first, second and third sections, the first and third sections each comprise a grating and the second section comprises a window configured to permit the spot of radiation to be directed to the radiation detector;
  the lithographic apparatus is configured such that the spot of radiation is projected onto the measurement target such that it scans across the first, second and third sections;
  the radiation detector comprises a radiation intensity sensor configured to detect the intensity of radiation from the spot directed to the radiation detector from the measurement target; and
  the controller is configured to control the programmable patterning device such that the beam of radiation providing the spot of radiation has a substantially constant intensity when it scans across the first and third sections and has a varying intensity at a reference position when the spot of radiation scans across the second section, and to determine the position of the spot of radiation based on the timing and/or phase of first, second and third signals from the radiation detector that correspond to the spot of radiation being projected onto the first, second and third sections respectively.

13. The lithographic apparatus according to claim 1, wherein:
  the measurement target comprises a plurality of sections, each section comprising a respective grating;
  the lithographic apparatus is configured such that the spot of radiation is projected onto the measurement target such that it scans across the sections of the measurement target;
  the radiation detector comprises a radiation intensity sensor configured to detect the intensity of radiation from the spot directed to the radiation detector from the measurement target;
  the controller is configured to control the programmable patterning device such that the beam of radiation providing the spot of radiation has a varying intensity at a substantially constant frequency at the point at which it is projected onto the target; and the controller is configured to determine the position of the spot of radiation relative to an intended position of the spot of radiation based on respective signals from the radiation detector corresponding to the spot of radiation being projected at the plurality of sections of the measurement target.

14. The lithographic apparatus according to claim 1, wherein:

the lithographic apparatus is configured such that the spot of radiation is projected onto the measurement target such that it is scanned across the measurement target;

the target comprises a slit configured to select a fraction of the area of the spot of radiation such that the fraction is directed to the radiation detector for each position of the spot of radiation relative to the measurement target; and the radiation detector comprises a radiation intensity sensor to detect the intensity of radiation from the spot directed to the radiation detector from the measurement target.

15. The lithographic apparatus according to claim 14, wherein the measurement target comprises at least first and second slits arranged such that, as the spot of radiation scans across the measurement target, it successively scans across each of the slits; and the first and second slits are arranged at respective different oblique angles to the direction of scanning of the spot of radiation across the target.

16. A method for measuring a radiation beam spot position in a lithographic apparatus that comprises a programmable patterning device to provide a plurality of radiation beams and a projection system to project the plurality of radiation beams onto a substrate to form respective spots of radiation, the method comprising:

projecting the spots of radiation onto a target comprising a plurality of measurement targets;

using a radiation detector to detect radiation from one of the spots of radiation that has been projected onto the measurement target;

controlling the position of the radiation detector, using an actuator system, relative to the plurality of measurement targets such that, at different respective positions, it can detect radiation that has been projected onto a different measurement target of the plurality of measurement targets; and determining at least the position of the spot of radiation relative to an intended position of the spot of radiation in a plane substantially parallel to a surface of the target based on information from the radiation detector.

17. The lithographic apparatus according to claim 1, further comprising a radiation detector alignment marker spatially fixed in relation to a substrate table to hold the substrate or in relation to the radiation detector, and a radiation detector alignment marker inspection system configured to inspect the radiation detector alignment marker and determine the position of the radiation detector relative to the substrate table or an object fixed to the substrate table based on the inspection of the radiation detector alignment marker.

18. The lithographic apparatus according to claim 2, wherein the radiation detector is in or on the substrate table.

19. A lithographic apparatus, comprising:

a programmable patterning device, configured to provide a plurality of radiation beams;

a projection system, configured to project the plurality of radiation beams onto a substrate to form respective spots of radiation; and a radiation spot measurement system, comprising:

a target, onto which the spots of radiation may be projected for a spot measurement process, the target comprising a measurement target, the measurement target comprising first, second and third sections, the first and third sections each comprising a grating and the second section comprising a window;

a radiation detector configured to detect radiation from one of the spots of radiation that has been projected onto the measurement target, the radiation detector comprising a radiation intensity sensor configured to detect the intensity of radiation from the spot and the window configured to permit the spot of radiation to be directed to the radiation detector; and a control system configured to provide relative movement between the spot of radiation and the first, second and third sections such the spot scans across the first, second and third sections, configured to control the programmable patterning device such that the beam of radiation providing the spot of radiation has a substantially constant intensity when it scans across the first and third sections and has a varying intensity at a reference position when the spot of radiation scans across the second section, and configured to determine at least the position of the spot of radiation relative to an intended position of the spot of radiation on the target in a plane substantially parallel to a surface of the target based on the timing and/or phase of first, second and third signals from the radiation detector that correspond to the spot of radiation being projected onto the first, second and third sections respectively.

20. A lithographic apparatus, comprising:

a programmable patterning device, configured to provide a plurality of radiation beams;

a projection system, configured to project the plurality of radiation beams onto a substrate to form respective spots of radiation; and a radiation spot measurement system, comprising:

a target, onto which the spots of radiation may be projected for a spot measurement process, the target comprising a measurement target, the measurement target comprising a plurality of sections, each section comprising a respective grating;

a radiation detector configured to detect radiation from one of the spots of radiation that has been projected onto the measurement target, the radiation detector comprising a radiation intensity sensor configured to detect the intensity of radiation from the spot; and a control system configured to provide relative movement between the spot of radiation and the plurality of sections such the spot scans across the sections, configured to control the programmable patterning device such that the beam of radiation providing the spot of radiation has a varying intensity at a substantially constant frequency at the point at which it is projected onto the target, and configured to determine at least the position of the spot of radiation relative to an intended position of the spot of radiation on the target in a plane substantially parallel to a surface of the target based on respective signals from the radiation detector corresponding to the spot of radiation being projected at the plurality of sections of the measurement target.

* * * * *